United States Patent [19]

Clecak et al.

[11] 4,284,706

[45] Aug. 18, 1981

[54] LITHOGRAPHIC RESIST COMPOSITION FOR A LIFT-OFF PROCESS

[75] Inventors: Nicholas J. Clecak; Barbara D. Grant; Carlton G. Willson, all of San Jose, Calif.

[73] Assignee: International Business Machines Corporation, Armonk, N.Y.

[21] Appl. No.: 99,806

[22] Filed: Dec. 3, 1979

[51] Int. Cl.³ .................. G03C 1/54; G03C 1/60; G03C 5/00

[52] U.S. Cl. .................. 430/191; 430/192; 430/193; 430/315; 430/326; 430/329; 430/330

[58] Field of Search ............... 430/191, 192, 193, 326, 430/329, 330, 315

[56] References Cited

U.S. PATENT DOCUMENTS

| | | | |
|---|---|---|---|
| 3,046,116 | 7/1962 | Schmidt | 430/193 |
| 3,201,239 | 8/1965 | Neugebauer et al. | 430/192 |
| 3,495,979 | 2/1970 | Laridon et al. | 430/193 |
| 3,661,582 | 5/1972 | Broyde | 430/193 |
| 3,666,473 | 5/1972 | Colom et al. | 430/192 |
| 3,849,136 | 11/1974 | Grebe | 430/314 |
| 3,950,173 | 4/1976 | Ross et al. | 430/193 |
| 3,982,943 | 9/1976 | Feng et al. | 430/314 |
| 4,093,461 | 6/1978 | Loprest et al. | 430/193 |
| 4,115,120 | 9/1978 | Dyer et al. | 430/315 |
| 4,123,279 | 10/1978 | Kobayashi | 430/193 |

OTHER PUBLICATIONS

Kammula, S., et al., *J. Org. Chem.*, vol. 42, No. 17, pp. 2931–2932, 1977.
Dinaburg, M. S., "Photosensitive Diazo Compounds," Focal Press, pp. 31–32 and 181–182, 1964.

*Primary Examiner*—Charles L. Bowers, Jr.
*Attorney, Agent, or Firm*—Joseph E. Kieninger

[57] ABSTRACT

Lithographic resist compositions are provided which permit an improved lift-off process in which the deposition mask with apertures has the desirable negative slope or overhang. The resist composition comprises a phenolic-aldehyde resin, a photosensitizer and Meldrum's diazo, or Meldrum's acid or suitable analogs thereof as a profile modifying agent. The profile modifying agents useful in the present invention have the formula:

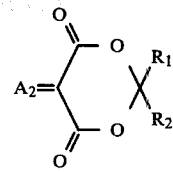

wherein $R_1$ is $C_1$ to $C_{20}$ alkyl or aryl, $R_2$ is H, $C_1$ to $C_{20}$ alkyl or aryl, or together $R_1$ and $R_2$ are cycloalkyl, A is N or H.

8 Claims, 6 Drawing Figures

LITHOGRAPHIC RESIST COMPOSITION FOR A LIFT-OFF PROCESS

DESCRIPTION

1. Technical Field

This invention relates to a lithographic resist composition for an improved lift-off process in which the deposition mask with apertures has the desirable negative slope or overhang, and more particularly to a resist composition containing a phenolic-aldehyde resin, a sensitizer, and Meldrum's diazo, or Meldrum's acid, or analogs thereof as a profile modifying agent.

It is a primary object of this invention to provide an improved lithographic resist composition for a lift-off process for forming thin film patterns with well defined edges.

It is another object of this invention to provide a lithographic resist composition which will provide an improved lift-off method wherein the deposition mask is formed with apertures having the desirable negative slope or overhang.

2. Background Art

Most present techniques in the formation of vacuum deposited thin metallic film patterns make the use of etching in the presence of etch-resist photoresist layers to provide the selected pattern. This, in effect, involves the traditional photoengraving or photolithographic etching process. However, with the continued miniaturization of semiconductor integrated circuits to achieve greater component density and smaller units in large scale integrated circuitry, the art is rapidly approaching a point where such photolithographic etching of deposited film may be impractical for providing the minute resolution required for the fine linework of metallization, particularly at metal thicknesses in the order of 8,000 A–25,000 A, in such large scale integrated circuitry.

An alternative method for forming such metallization in large scale integrated circuitry, which is presently under consideration and use in the art, is commonly denoted by the term "expendable mask method," "lift-off method," or "stencil method." The following references are typical of those describing these known types of methods.

1. T. D. Schlabak et al, "Printed and Integrated Circuitry" pp 352–362, McGraw-Hill, New York 1963;
2. K. C. Hu, "Expendable Mask A New Technique for Patterning Evaporated Metal Films," *Electron Packaging and Production*, October 1967;
3. M. Hatzakis, "Electron Resist for Micro-Circuit and Mask Production," *Journal of the Electrochemical Society*, Vol. 116, p. 1033, 1969;
4. H. I. Smith et al, "A High-Yield Photolithographic Technique for Surface Wave Devices," *Journal of the Electrochemical Society*, Vol. 118, p. 821, 1971.

U.S. Pat. Nos. 3,849,136 and 3,982,943 are typical of patents directed to a lift-off method and structure for depositing thin films which avoid the "edge-tearing" problem by providing deposition masks with apertures having a negative slope or overhang. Because of this overhang, when thin films, particularly metal films, are deposited over the structure and the remaining photoresist is removed by standard lift-off techniques, the "edge-tearing" problem is minimized. Both of these patents provide effective techniques for forming deposition masks with such overhangs. However, they must use a series of depositions and etching steps in order to produce the final deposition mask with the desirable overhang.

U.S. Pat. No. 4,115,120 describes another lift-off process which involves partially curing the photoresist while maintaining the surface of the photoresist layer interfacing with the substrate at a lower temperature than the opposite or exposed surface of the photoresist that is being exposed to the heat. While this technique does form a deposition mask with the desired overhang, it also requires a cooling apparatus and careful control of the temperature during the critical processing steps.

DISCLOSURE OF THE INVENTION

According to the present invention, lithographic resist compositions are provided which provide an improved lift-off process in which the deposition mask with apertures has the desirable negative slope or overhang. The resist composition comprises a phenolic-aldehyde resin, a sensitizer, and Meldrum's diazo or a suitable analog as a profile modifying agent.

The profile modifying agents useful in the present invention have the formula

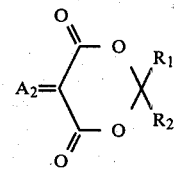

wherein $R_1$ is alkyl or aryl having up to 20 carbon atoms, $R_2$ is H, alkyl or aryl having up to 20 carbon atoms, or together $R_1$ and $R_2$ are cycloalkyl, and A is N or H. Examples of two profile modifier agents are Meldrum's diazo where A=N and $R_1=R_2=CH_3$ and Meldrum's acid where A=H and $R_1=R_2=CH_3$.

The presence of the profile modifier agent in the photoresist composition is what causes the deposition mask with apertures to have the desirable negative slope or overhang which is necessary to form thin film metal patterns with well defined edges. The profile modifier agent forms a skin at the surface of the photoresist during the bake step. This skin causes a negative slope in the mask to be formed during the developing step.

BRIEF DESCRIPTION OF DRAWINGS

In the accompanying drawings forming a material part of this disclosure.

BEST MODE FOR CARRYING OUT THE INVENTION

Figure 1A:
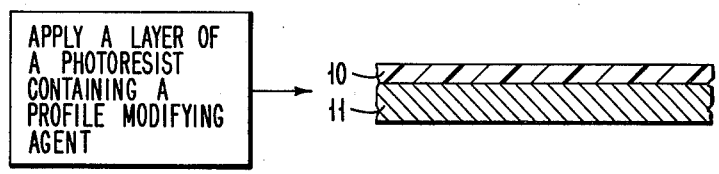
FIGS. 1A through 1F are diagrammatic fragmentary cross-sectional views of the structure being fabricated in accordance with the preferred embodiments of the present invention as well as a flow chart describing each of these steps.

FIGS. 1A through 1F show the formation of a mask in accordance with the present invention as well as the utilization of this mask for lift-off purposes. With reference to FIG. 1A, a layer of photoresist material 10 containing a profile modifying agent is formed on a semiconductor substrate 11. In the fabrication of integrated circuits, substrate 11 may be a semiconductor material or a semiconductor substrate having a surface layer of an electrically insulative material, such as silicon dioxide or silicon nitride.

Layer 10 may be formed of a photoresist composition such as described in U.S. Pat. No. 3,666,473 that has a profile modifying agent added thereto. Other photoresist compositions such as those described in U.S. Pat. No. 3,201,239 or a commercially available photoresist such as Shipley's AZ1350J may be used in combination with the profile modifying agent to form layer 10. The photoresist composition is applied to substrate 11 by conventional spin-coating at about 4,000 RPM.

The profile modifying agents useful in the present invention have the formula

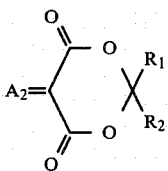

wherein $R_1$ is alkyl or aryl having up to 20 carbon atoms, $R_2$ is H, alkyl or aryl having up to 20 carbon atoms, or together $R_1$ and $R_2$ are cycloalkyl, and A is N or H.

The concentration of the profile modifying agent in the photoresist compositions referred to above may vary from 5% to the saturation point depending upon the degree of lift-off profile modification required. The saturation point is defined as the concentration of profile modifying agent that causes the photoresist composition to contain more than one phase.

A preferred profile modifying agent is Meldrum's diazo. The systematic chemical name for Meldrum's diazo is 2,2-dimethyl-4,6-diketo-5-diazo-1,3-dioxane and its formula is

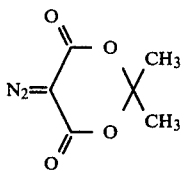

Another preferred compound is Meldrum's acid having the formula

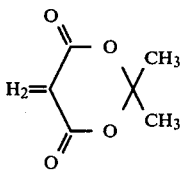

Figure 1B:
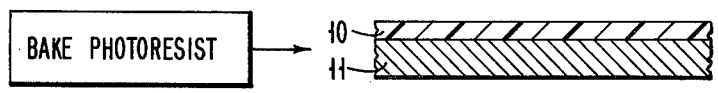

Next, the photoresist is baked as shown in FIG. 1B. The photoresist coated wafer is baked at a temperature from 82° to 84° C. for a period of from 15 to 30 minutes. During this baking step, the profile modifier agent forms a skin at the surface of the photoresist.

Figure 1C:
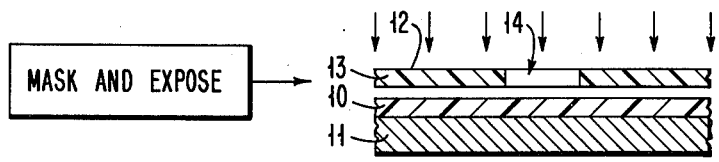

Next, as shown in FIG. 1C, the structure is masked with a mask 12 having transparent regions 14 and opaque regions 13. The mask is shown in the illustration as being slightly offset from the surface merely for purposes of clarity. Exposure is to a 200 watt mercury lamp for approximately 10 seconds. As a result of this exposure, the portion of the photoresist layer 10 beneath the transparent region 14 will become solubilized. The extent of solubilization in the portion of the photoresist layer 10 which is adjacent to that region beneath the transparent region 14 will depend upon the amount of profile modifier agent present in the photoresist composition, that is, how thick a skin is formed on the surface of the photoresist layer.

Figure 1D:
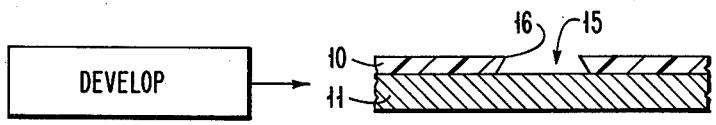

As shown in FIG. 1D, the structure is subjected to a developing step utilizing a conventional alkaline developer for positive photoresist, that is, a 2.5% by weight solids in aqueous solution of a mixture of sodium metasilicate in sodium phosphate diluted 1 part with 3 parts water, predominately sodium orthophosphate, having a pH at room temperature in the order of 12.55, for about 30 seconds. As a result apertures 15 will be formed through the photoresist layer 10 in a pattern corresponding to the transparent regions 14 in mask 12. Each of the apertures will have a negative slope because the photoresist material at the bottom portion of the apertures will not be as extensively cured as the material in the upper portion and thus the photoresist material in the bottom portion would be more extensively solubilized upon exposure to light in the previous step of 1C. Thus, the photoresist defining aperture will have the overhang 16 required for effective lift-off processing.

Figure 1E:
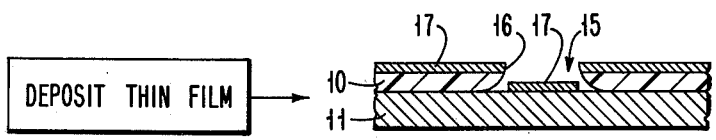

Next, FIG. 1E using photoresist layer 10 as a deposition mask for the substrate, a metallic film 17 is deposited at a temperature between room temperature and 100° C. Alternately, layer 17 may be an inorganic electrically insulative material such a silicon dioxide or silicon nitride. These insulative materials may be deposited in any conventional sputter deposition system. In the embodiment shown, a metallic film is used. The metal may be any metal conventionally used for integrated circuit metallization, that is, aluminum-copper alloys, platinum, paladium, chromium, silver, tantalum, gold and titanium or combinations thereof. Metallic film 16 has a thickness on the order of 0.5 micron.

Figure 1F:
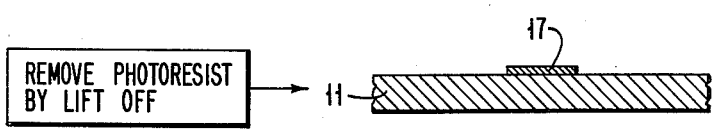

Next, FIG. 1F, using conventional lift-off techniques, photoresist masking layer 10 is completely removed by immersion into a solvent such as N-methyl-2-pyrrolidinone, a standard photoresist stripping solvent for about 10 minutes using ultrasonic agitation. This leaves thin metal film 17 in the desired preselected configuration. The solvent selected should be one which dissolves or swells the polymeric material of layer 10 without affecting the thin metallic film 17. Such solvents include acetone, butylacetate, trichloroethylene and Cellosolve acetate.

INDUSTRIAL APPLICABILITY

Example No. 1

A photoresist composition containing 68.98 grams phenolic resin, 156 grams of diglyme, 14.88 grams (sensitizer) diazonaphthoquinone and 11.16 grams Meldrum's diazo was formed. This photoresist composition was applied to the substrate by conventional spin-coating and subjected to the steps set forth in FIGS. 1B through 1F. This photoresist composition formed a negative slope in the mask similar to that shown in FIG. 1E and provided a metal pattern of the type shown in FIG. 1F.

Example No. 2

A photoresist composition containing 68.98 grams phenolic resin, 156 grams diglyme, 14.88 grams (sensitizer) diazonaphthoquinone and 11.16 grams of Meldrum's acid was used in the same manner described for Example 1. A negative slope as shown in FIG. 1E was obtained as was a metal pattern as shown in FIG. 1F.

While the invention has been particularly shown and described with reference to the preferred embodiments thereof, it will be understood by those skilled in the art that the foregoing and other changes in form and details may be made therein without departing from the spirit, scope and teaching of the invention. Accordingly, the composition and method herein disclosed are to be considered merely as illustrative, and the invention is to be limited only as specified in the claims.

We claim:

1. A lithographic resist composition for use in a lift-off process with ultra-violet light to form a mask with apertures having a negative slope comprising a phenolic-aldehyde resin, a naphthoquinone diazide sulfonic acid ester sensitizer and in admixture therewith a profile modifying agent having the formula

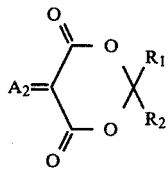

wherein $R_1$ is alkyl or aryl having up to 20 carbon atoms, $R_2$ is H, alkyl or aryl having up to 20 carbon atoms, or together $R_1$ and $R_2$ are cycloalkyl and A is N or H.

2. A composition as claimed in claim 1 wherein the release material is present in an amount of from about 5% to the saturation level.

3. A composition as claimed in claim 1 wherein the resin is a cresol-formaldehyde resin.

4. A composition as claimed in claim 1 wherein the profile modifying agent is Meldrum's diazo.

5. A lithographic resist composition for use in a lift-off process with ultra-violet light to form a mask with apertures having a negative slope comprising a phenolic-aldehyde resin, a naphthoquinone diazide sulfonic acid ester sensitizer and in admixture therewith a profile modifying agent that is Meldrum's acid.

6. A lift-off process for forming a lithographic resist image comprising baking a film comprising a phenolic-aldehyde resin, a naphthoquinone diazide sulfonic acid ester sensitizer and in admixture therewith a profile modifying agent having the formula

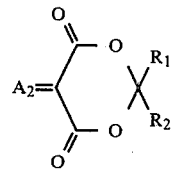

wherein $R_1$ is alkyl or aryl having up to 20 carbon atoms, $R_2$ is H, alkyl or aryl having up to 20 carbon atoms, or together $R_1$ and $R_2$ are cycloalkyl, and A is N or H at a temperature for a time sufficient for said profile modifying agent to form a skin at the surface of said film, image-wise exposing said baked film to ultraviolet light, and dissolving the exposed portions of said film with aqueous alkali to form a mask with apertures having a negative slope.

7. A process as claimed in claim 6 wherein the profile modifying agent is Meldrum's diazo.

8. A process as claimed in claim 6 wherein the profile modifying agent is present in an amount of from about 5% to the saturation level.

* * * * *